United States Patent
Kim et al.

(10) Patent No.: US 8,076,692 B2
(45) Date of Patent: Dec. 13, 2011

(54) LED PACKAGE

(75) Inventors: Hyung Kun Kim, Gyeonggi-do (KR); Ho Sun Paek, Gyeonggi-do (KR); Suk Ho Jung, Gyeonggi-do (KR); Hak Hwan Kim, Gyeonggi-do (KR); Young Jin Lee, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 68 days.

(21) Appl. No.: 12/255,469

(22) Filed: Oct. 21, 2008

(65) Prior Publication Data

US 2010/0051985 A1 Mar. 4, 2010

(30) Foreign Application Priority Data

Sep. 4, 2008 (KR) .................. 10-2008-0087133

(51) Int. Cl.
*H01L 33/00* (2010.01)
*H01L 23/34* (2006.01)

(52) U.S. Cl. ................... 257/99; 257/713; 257/E33.059

(58) Field of Classification Search ........... 257/E33.061, 257/98, E33.075, E33.058, E33.059, 722, 257/713

See application file for complete search history.

(56) References Cited

U.S. PATENT DOCUMENTS

| | | | | |
|---|---|---|---|---|
| 6,188,130 B1 * | 2/2001 | Ramirez et al. | ............... | 257/706 |
| 7,196,904 B2 * | 3/2007 | Ku | ................................ | 361/703 |
| 2002/0018338 A1 * | 2/2002 | McCullough | ................ | 361/709 |
| 2004/0037043 A1 | 2/2004 | Ku | | |
| 2004/0256630 A1 * | 12/2004 | Cao | ................................ | 257/98 |

FOREIGN PATENT DOCUMENTS

| | | |
|---|---|---|
| JP | 2001-024112 | 1/2001 |
| JP | 2002-539623 | 11/2002 |
| JP | 2003-338639 | 11/2003 |
| JP | 2005-093097 | 4/2005 |
| JP | 2005-116990 | 4/2005 |
| JP | 2005-521251 | 7/2005 |
| KR | 10-0668648 B1 | 1/2007 |
| KR | 10-2008-0030584 A | 4/2008 |
| WO | WO 00/55914 | 9/2000 |
| WO | WO 03/081127 A2 | 10/2003 |
| WO | WO 2006/128318 A1 | 12/2006 |
| WO | WO 2008/043264 A1 | 4/2008 |
| WO | WO 2008/100298 A1 | 8/2008 |

OTHER PUBLICATIONS

Japanese Office Action, w/ English translation thereof, issued in Japanese Patent Application No. JP 2008-278485 dated Jul. 19, 2011.

* cited by examiner

*Primary Examiner* — Wael Fahmy
*Assistant Examiner* — Sarah Salerno
(74) *Attorney, Agent, or Firm* — McDermott Will & Emery LLP

(57) ABSTRACT

The present invention provides an LED package including: a heat discharge body provided with a plurality of radially protruding heat discharge fins at an outer circumferential surface and molding material filled spaces between the heat discharge fins; a package body which is received on a top surface of the heat discharge body and has a cavity; a pair of lead frames extended from upper parts of the heat discharge body to both sides thereof; and an LED chip mounted inside the cavity.

12 Claims, 5 Drawing Sheets

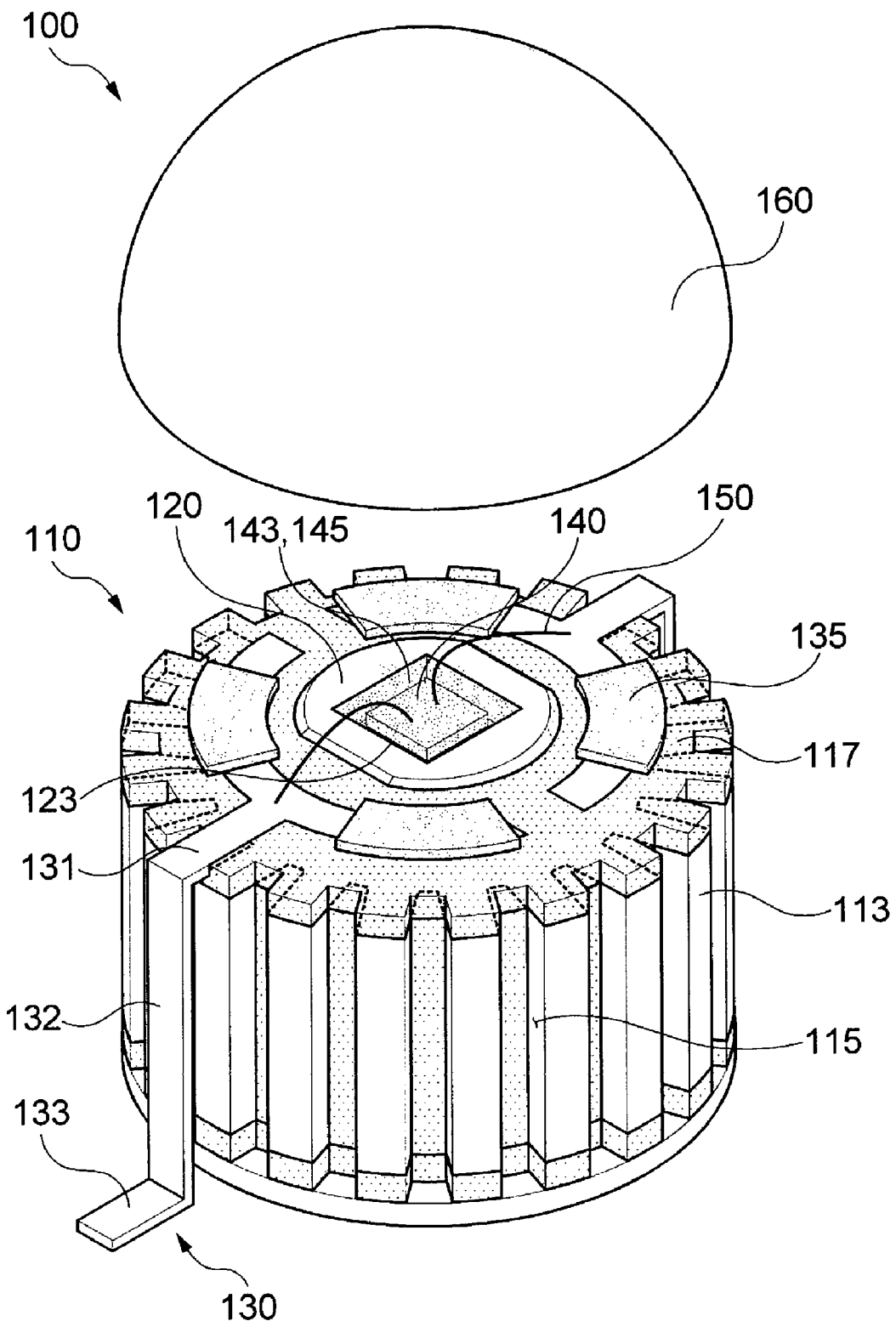
[FIG. 1]

[FIG. 2A]
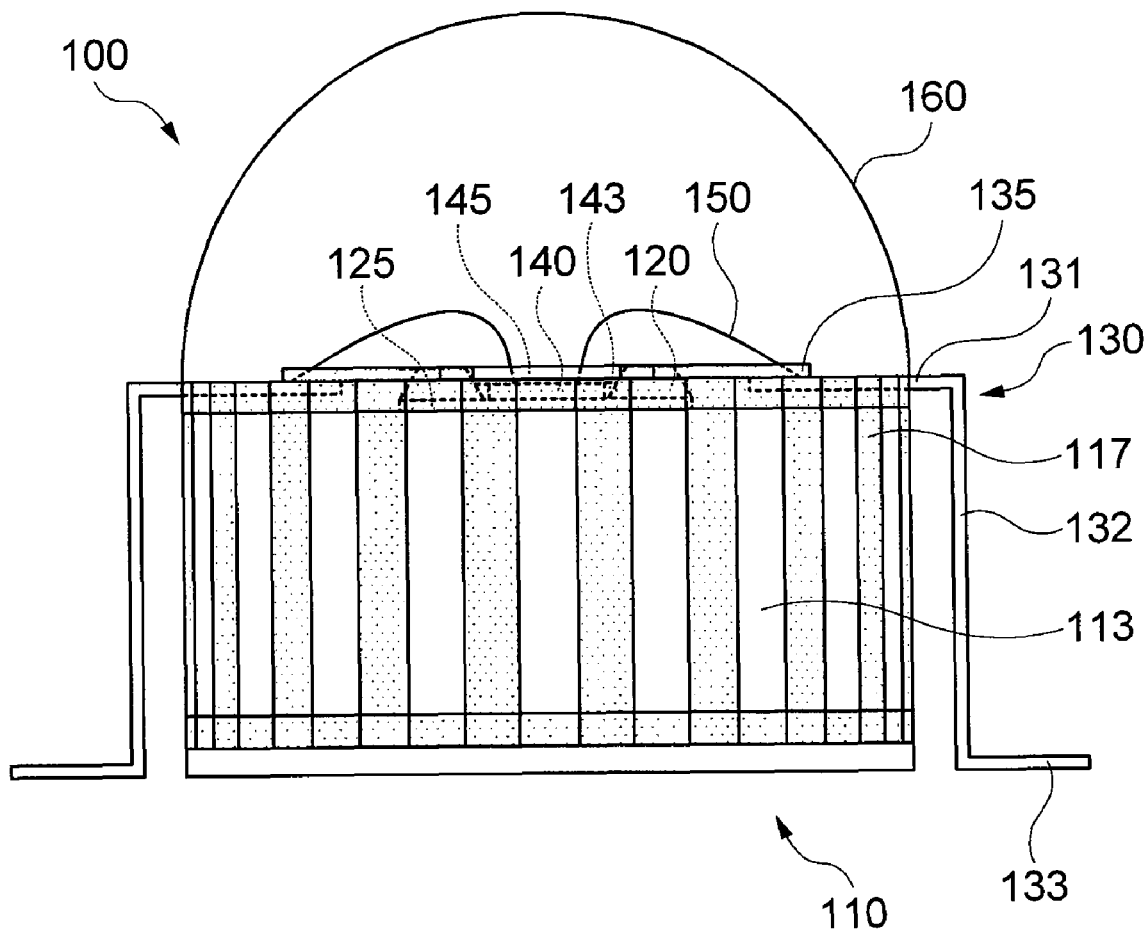
[FIG. 2B]
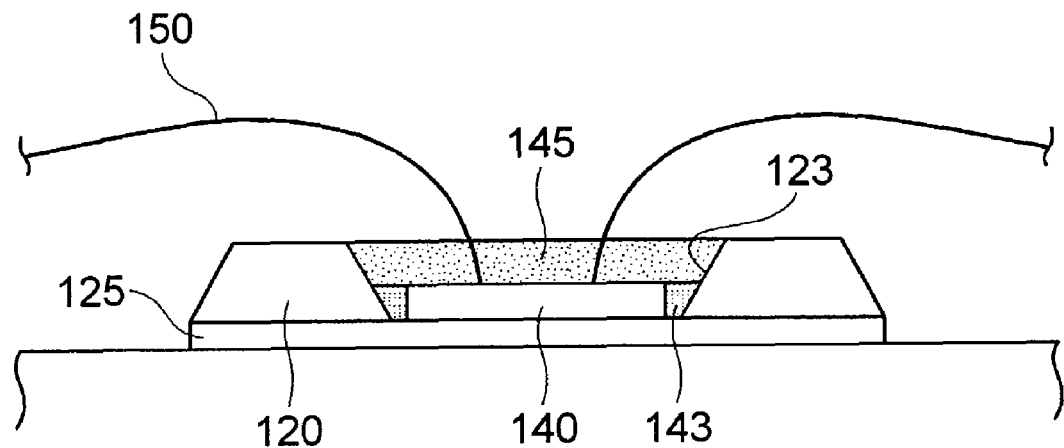

[FIG. 3A]
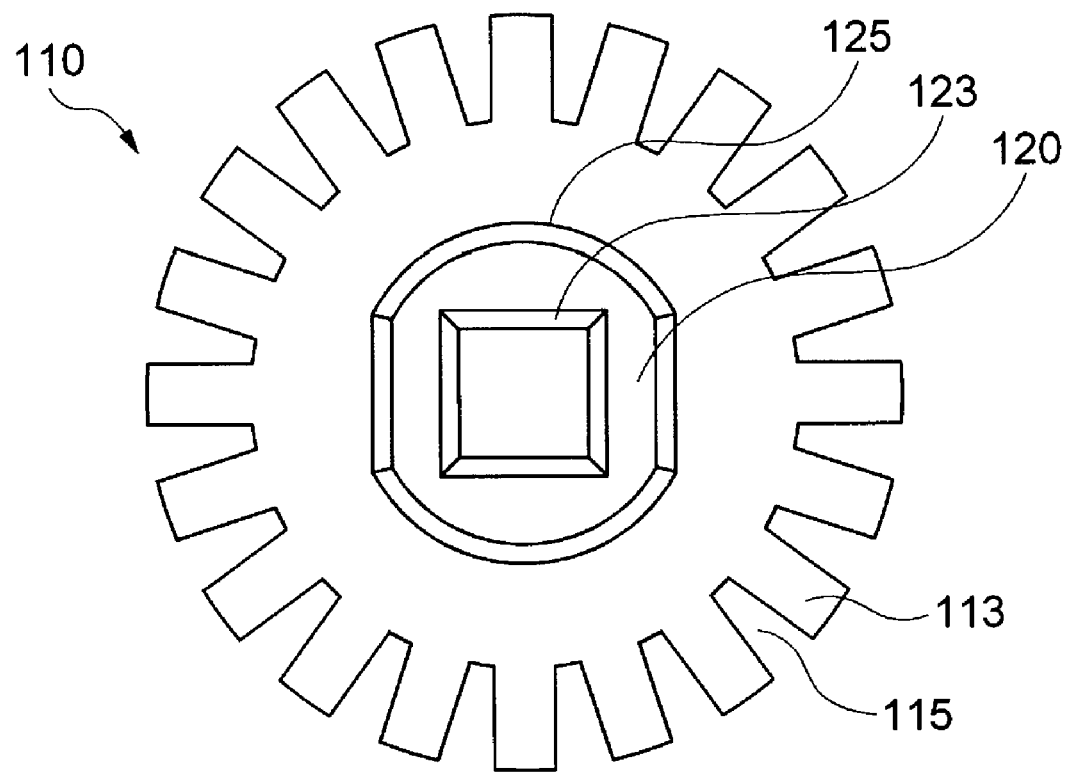
[FIG. 3B]
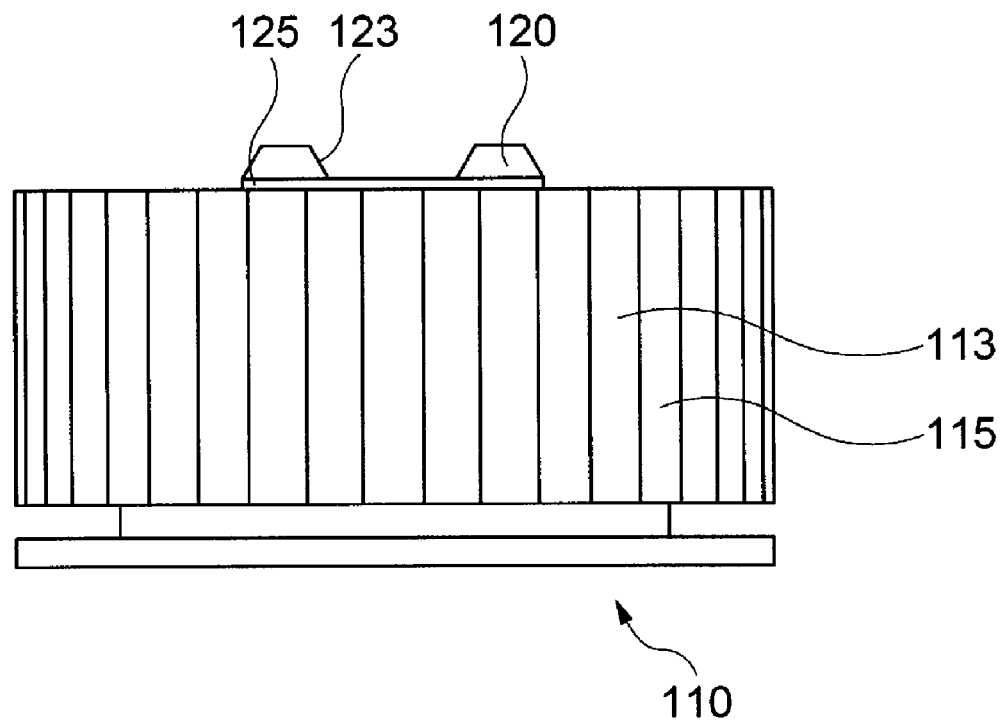

[FIG. 4A]
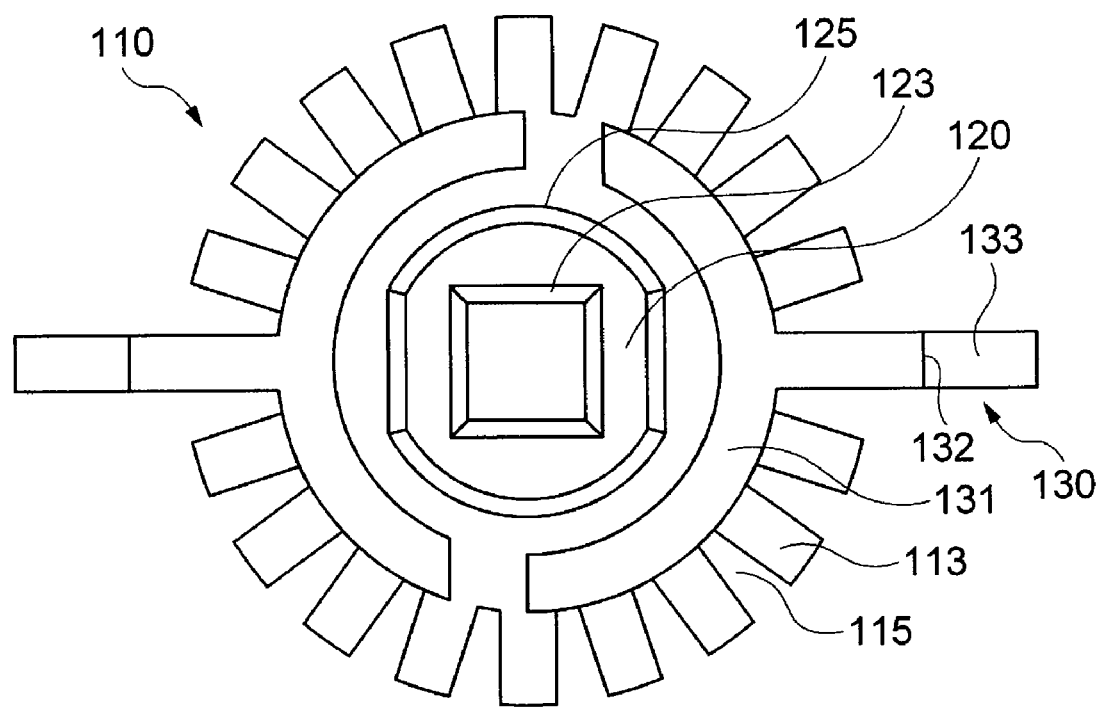
[FIG. 4B]
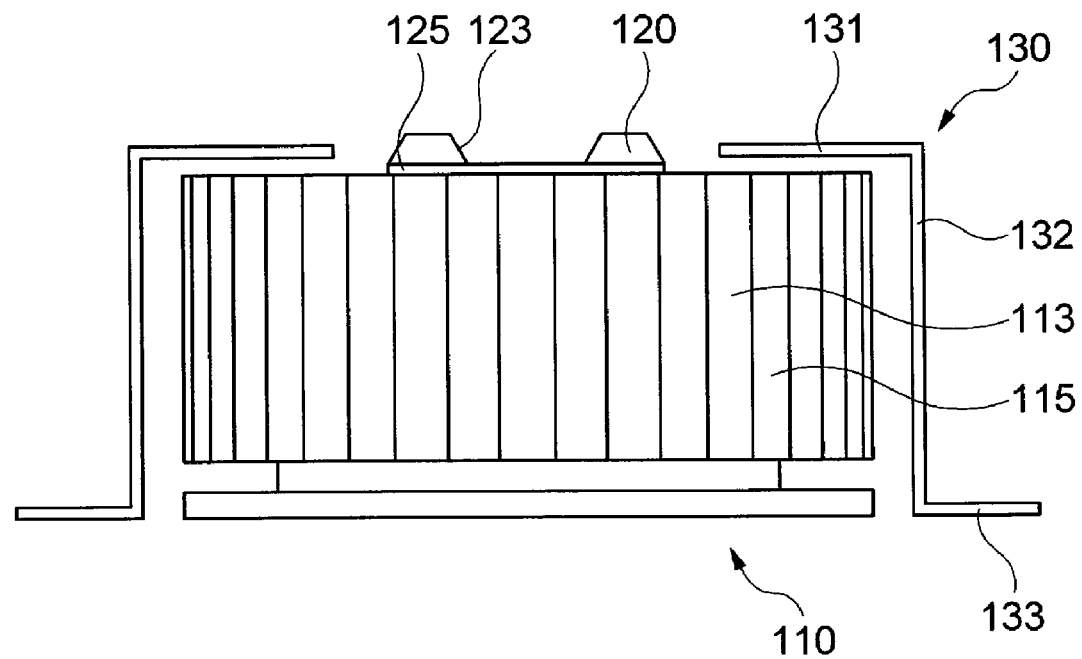

[FIG. 5A]
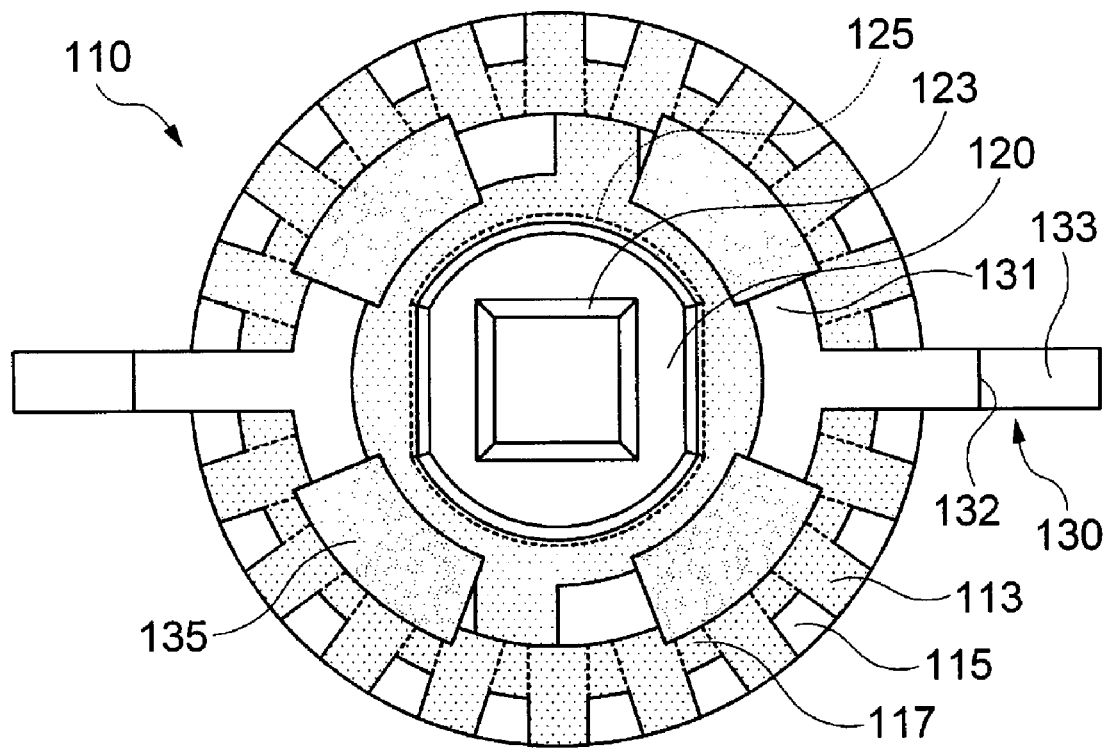
[FIG. 5B]
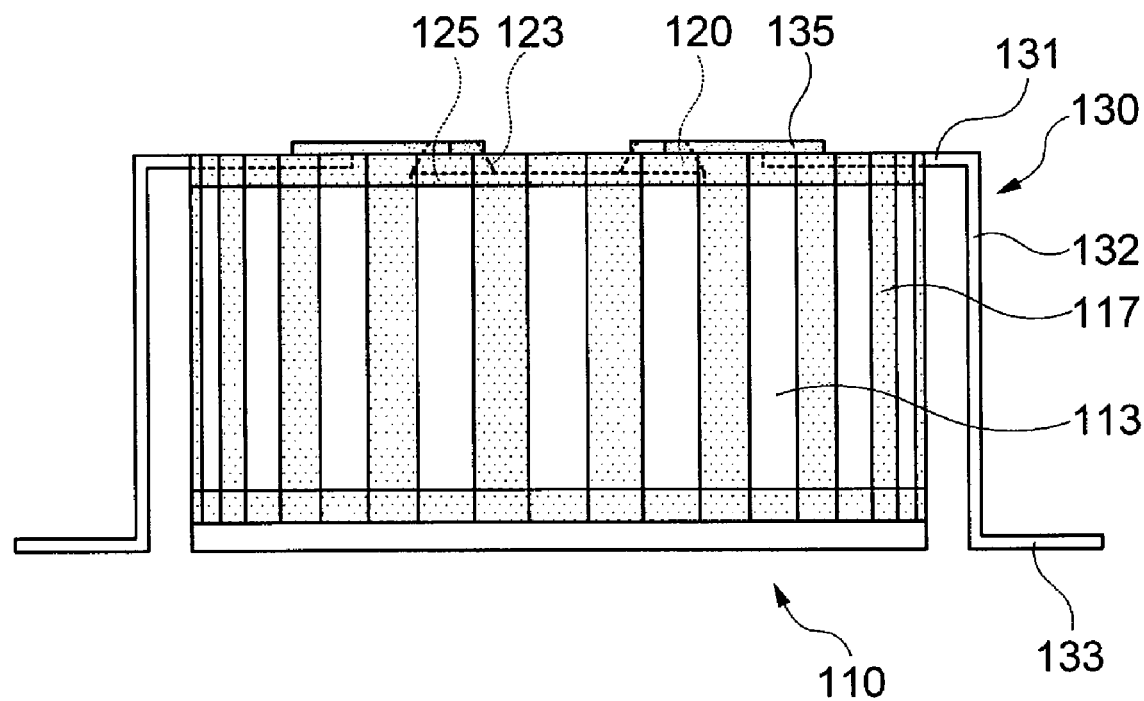

LED PACKAGE

CROSS-REFERENCE TO RELATED APPLICATIONS

This application claims the benefit of Korean Patent Application No. 10-2008-0087133 filed with the Korea Intellectual Property Office on Sep. 4, 2008, the disclosure of which is incorporated herein by reference.

BACKGROUND OF THE INVENTION

1. Field of the Invention

The present invention relates to an LED (Light Emitting Diode) package; and, more particularly, to an LED package capable of maximizing heat discharge effect.

2. Description of the Related Art

Recently, an LED (Light Emitting Diode) device using compound semiconductor material such as GaAs, GaN and AlGaInP has been developed and so it has been possible to implement a multicolored light emitting source. Elements, which determine a characteristic of an LED product, include color, brightness, optical conversion efficiency, and so on. The characteristic of the LED product is primarily determined by the compound semiconductor material used to the LED device and a structure thereof, but it is greatly influenced by a package structure for mounting an LED chip as a secondary element.

In order to obtain light emitting effect according to the user's demand, it is needed to improve a structure and material of an LED package or the like as well as a primary element including material or a structure of the LED chip or the like.

Particularly, as an application range of the LED package has been expanded to various fields such as indoor and outdoor illumination apparatuses, an automobile headlight, and a backlight unit of an LCD (Liquid Crystal Display), high efficiency and a high heat discharge characteristic have been needed.

If heat generated from the LED chip is not discharged from the LED package effectively, a temperature of the LED chip rises, thereby deteriorating a characteristic of the LED chip and reducing a lifetime. Therefore, in the high power LED package, a new method for effectively discharging the heat generated from the LED chip has been required.

And, in applying the LED package to the illumination device or the backlight unit, a light direction angle of emission light of the LED package should be secured. At this time, a size of the LED chip is needed to be minimized. Accordingly, a cavity is formed in a package mold unit made of resin and the LED chip is mounted inside the cavity.

However, in this case, the package mold unit made of the resin is discolored by being exposed to high temperature and high power for a long time. As a result, a lifetime of the LED package is reduced by deteriorating brightness of the LED package.

SUMMARY OF THE INVENTION

The present invention has been invented in order to overcome the above-described problems and it is, therefore, an object of the present invention to provide an LED package capable of maximizing heat discharge effect by including a plurality of radially protruding heat discharge fins at an outer circumferential surface of a heat discharge body.

In accordance with one aspect of the present invention to achieve the object, there is provided an LED package including: a heat discharge body provided with a plurality of radially protruding heat discharge fins at an outer circumferential surface and molding material filled spaces between the heat discharge fins; a package body which is received on a top surface of the heat discharge body and has a cavity; a pair of lead frames extended from upper parts of the heat discharge body to both sides thereof; and an LED chip mounted inside the cavity.

Further, the package body may be made of metal.

Further, inner side surfaces of the cavity may be inclined surfaces.

Further, the lead frame may include a receiving unit provided on the upper part of the heat discharge body, an outer bent unit extended and bent from an end of the receiving unit in a vertical direction, and a lower end bent unit extended and bent from an end of the outer bent unit in a vertical direction with respect to the outer bent unit.

Further, a filler may be coated inside the cavity to protect the LED chip.

The filler may be made of light transmitting resin.

Further, a fluorescent material may be coated on the filler.

Further, a molding material may be filled in the molding material filled spaces, a bottom surface and a top surface of the heat discharge body, and between the lead frames.

Further, the molding material may be filled in portions of the molding material filled spaces to expose ends of the heat discharge fins.

Further, the LED package may further include molding fixing units on top surfaces of the lead frames to fix the lead frames.

Further, the LED package may further include wires for electrical connection between the LED chip and the lead frames.

Further, the LED package may further include a lens coupled to an upper part of the heat discharge body.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is an exploded perspective view illustrating an LED package in accordance with an embodiment of the present invention;

FIG. 2a is a side view illustrating the LED package in accordance with the embodiment of the present invention;

FIG. 2b is a schematic plan-view illustrating a package body of the LED package in accordance with the embodiment of the present invention;

FIG. 3a and FIG. 3b are a plan-view and a front view illustrating a process of receiving the package body on a top surface of the heat discharge body in accordance with the embodiment of the present invention;

FIG. 4a and FIG. 4b are a plan-view and a front view illustrating a process of forming a pair of lead frames at both upper parts of the heat discharge body receiving the package body in accordance with the embodiment of the present invention; and FIG. 5a and FIG. 5b are a plan-view and a front view illustrating a process of injecting a molding material to the heat discharge body which receives the package body on the top surface and includes the lead frames at the both upper parts.

DETAILED DESCRIPTION OF THE PREFERABLE EMBODIMENTS

A matter regarding to an operation effect including a technical configuration for an LED package in accordance with the present invention will be clearly appreciated through the following detailed description with reference to the accompanying drawings illustrating a preferable embodiment of the present invention.

Hereinafter, an LED package in accordance with an embodiment of the present invention will be described in detail with reference to FIG. 1 to FIG. 5b.

FIG. 1 is an exploded perspective view illustrating an LED package in accordance with an embodiment of the present invention, FIG. 2a is a side view illustrating the LED package in accordance with the embodiment of the present invention, FIG. 2b is a schematic plan-view illustrating a package body of the LED package in accordance with the embodiment of the present invention, FIG. 3a and FIG. 3b are a plan-view and a front view illustrating a process of receiving the package body on a top surface of the heat discharge body in accordance with the embodiment of the present invention, FIG. 4a and FIG. 4b are a plan-view and a front view illustrating a process of forming lead a pair of lead frames at both upper parts of the heat discharge body receiving the package body in accordance with the embodiment of the present invention and FIG. 5a and FIG. 5b are a plan-view and a front view illustrating a process of injecting a molding material to the heat discharge body receiving the package body on a top surface and including the lead frames at the both upper parts.

As shown in FIG. 1, in accordance with the embodiment of the present invention, the LED package 100 includes a heat discharge body 110 provided with a plurality of heat discharge fins 113, a package body 120 which is received on a top surface of the heat discharge body 110, and a pair of lead frames 130 which extended from upper parts of the heat discharge body 110 to both sides thereof and an LED chip 140.

And, the package body 120, as shown in FIG. 2a and FIG. 2b, includes a cavity 123 formed at a portion thereof, the LED chip 140 is mounted inside the cavity 123, and a filler 143 and a fluorescent material 145 are coated inside the cavity 123. Then, the LED chip 140 is electrically connected to the lead frames 130 by being bonded with wires (150), which will be described in detail hereinafter.

First of all, as shown in FIG. 3a and FIG. 3b, the plurality of radially protruding heat discharge fins 113 are provided on an outer circumferential surface of the heat discharge body 110 at equal intervals. At this time, the heat discharge fins 113 may be formed through a surface treatment process applying the etching reaction of chemicals such as an etching or molding process.

And, molding material filled spaces 115 which are filled with a molding material 117 afterward are formed between the heat discharge fins 113 and the molding material 117 is filled in portions of the molding material filled spaces 115. As a result, ends of the heat discharge fins 113 are exposed outside the molding material 117 and so an area in contact with external air is increased, thereby maximizing heat discharge effect of the LED package 100.

Further, the package body 120 is received on a top surface of the heat discharge body 110 and the cavity 123, which mounts the LED chip 140 afterward, is formed at a portion of the package body 120 through an etching or punching process.

At this time, it is preferable that inner side surfaces of the cavity 123 are inclined surfaces to effectively discharge light generated from the LED chip 140 outside.

And, because the package body 120 is made of metal, although the inner side surfaces of the cavity 123 formed on the package body 120 is exposed to high temperature due to the LED chip 140 for a long time, it is not easily discolored and therefore a lifetime of the LED package can be extended by preventing deterioration of brightness of the LED package 100, whereby it is possible to be applied to the high power LED package 100.

Further, a bottom surface of the package body 120 is formed by a substrate 125 which plays a role of transmitting heat generated when the LED chip 140 mounted inside the cavity 123 emits light to the heat discharge body 110.

Therefore, it is preferable that the substrate 125 is made of metal with high thermal conduction, for example, copper, silver, aluminum, iron, nickel and tungsten.

Then, as shown in FIG. 4a and FIG. 4b, the pair of lead frames 130 are formed at the both upper parts of the heat discharge body 110 receiving the package body 120.

At this time, each of the lead frames 130 includes a receiving unit 131 which is provided on the upper part of the heat discharge body 110, an outer bent unit 132 which is extended and bent from an end of the receiving unit 131 along a vertical direction, that is, an outer longitudinal direction of the heat discharge body 110 and a lower end bent unit 133 which is extended and bent from an end of the outer bent unit 132 in a vertical direction with respect to the outer bent unit 132.

And, it is preferable that the lead frames 130 are made of copper with high thermal conduction to effectively discharge the heat generated from the LED chip 140 mounted inside the cavity 123.

Then, as shown in FIG. 5a and FIG. 5b, the molding material 117 is filled in the molding material filled spaces 115 between the heat discharge fins 113 provided on the heat discharge body 110, a bottom surface and a top surface of the heat discharge body 110, and between the lead frames 130.

Further, molding fixing units 135 for integrally fixing the lead frames 130 are formed on top surfaces of the receiving units 131 of the lead frames 130.

At this time, the molding material 117 filled in the molding material filled spaces 115 between the heat discharge fins 113, as described above, is filled in the portions of the molding material filling spaces 115. Therefore, when coating the molding material 117 in the molding material filled spaces 115, the molding material 117 may be filled through an external mold (not shown in the drawings) which is additionally manufactured outside the heat discharge body 110.

At this time, the external mold (not shown in the drawings) includes a plurality of grooves at positions corresponding to the molding material filled spaces 115 inside to be received in the other portions of the molding material filled spaces 115 between the heat discharge fins 113.

Therefore, when the external mold wraps an outside of the heat discharge body 110, the grooves are received in the other portions of the molding material filled spaces 115 and void spaces except for groove-receiving spaces are formed in the molding material filled spaces 115.

Then, after coating the molding material 117 in the void spaces, when the external mold is separated from the heat discharge body 110 before curing the molding material 117, as shown in FIG. 5a, only the portions of the molding material filled spaces 115 are filled with the molding material 117, thereby exposing the ends of the heat discharge fins 113 outside the molding material 117.

Accordingly, the heat generated from the LED chip 140 can be more effectively discharged outside through the heat discharge fins 113.

As described above, after filling the molding material 117 in the molding material filled spaces 115 between the heat discharge fins 113, the bottom surface and the top surface of the heat discharge body 110, and between the lead frames 130, as shown in FIG. 1 and FIG. 2a, the LED chip 140 is mounted inside the cavity 123.

At this time, the LED chip 140 uses a general type LED chip, and preferably, may use a GaN based LED chip.

Then, the LED chip 140 and the top surfaces of the receiving units 131 of the lead frames 130 are electrically connected to each other by being bonded with wires 150.

At this time, it is preferable that the wires 150 are connected to portions of the lead frames 130 except for the molding fixing units 135 provided on the receiving units 131 and the wires 150 is mainly made of gold(Ag).

And, the filler 143 is coated inside the cavity 123 to protect the LED chip 140. The filler 143 may be made of light transmitting resin with a high light transmitting property, for example, silicon resin, epoxy resin, or the like.

Further, on the filler 143, at least one fluorescent material 145 may be coated so that a light source supplied to a backlight unit is displayed in white light.

In this case, when the LED chip 140 emits light, the light with wavelength ranges of R,G,B generated according to a difference of semiconductor material forming the LED chip 140 is converted into the white light by the fluorescent material 145 coated on the filler 143 and emits the light from the LED package 100 to be supplied as the light source of the white light.

And, if a lens 160 which emits the light generated from the LED chip 140 in a wide direction angle is closely adhered to an upper part of the heat discharge body 110 to cover the receiving units 131 of the lead frames 130 connected to the LED chip 140 through the wires 150, as shown in FIG. 1, the LED package 100 is completed.

As described above, in the LED package 100 in accordance with the embodiment of the present invention, when the LED chip 140 mounted in the cavity 123 is supplied with power, the heat generated from the LED chip 140 may be discharged outside through the lead frames 130 or discharged outside by being transmitted to the heat discharge body 110 through the bottom surface of the package body 120, that is, the substrate 125.

At this time, it is possible to maximize the heat discharge effect of the LED package 100 by increasing the area in contact with the external air by including the plurality of radially protruding heat discharge fins 113 at the outer circumferential surface of the heat discharge body 110.

In addition, it is possible to implement the LED package capable of being applied to various fields needing high power such as an illumination device and a backlight unit by preventing deterioration of the brightness and reduction of the lifetime of the LED package by forming the cavity in the package body made of metal and mounting the LED chip inside the cavity.

As described above, although the preferable embodiment of the present invention has been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. An LED package comprising:
    a heat discharge body including:
        a circular top surface;
        a cylindrical side surface;
        a bottom surface;
        a plurality of radially protruding heat discharge fins disposed in a vertical direction on the cylindrical side surface and
        a molding material disposed on a space between the plurality of discharge fins on the cylindrical side surface and on top and bottom surfaces of the plurality of discharge fins in a vertical direction;
    a package body which is received on a top surface of the heat discharge body and includes a cavity;
    a pair of lead frames extended from upper parts of the heat discharge body to both sides thereof; and
    an LED chip mounted inside the cavity,
    wherein the molding material is filled in portions of the molding material filled spaces to expose ends of the heat discharge fins.

2. The LED package of claim 1, wherein the package body is made of metal.

3. The LED package of claim 1, wherein inner side surfaces of the cavity are inclined surfaces.

4. The LED package of claim 1, wherein the lead frame includes a receiving unit provided on the upper part of the heat discharge body, an outer bent unit extended and bent from an end of the receiving unit in a vertical direction and a lower end bent unit extended and bent from an end of the outer bent unit in a vertical direction with respect to the outer bent unit.

5. The LED package of claim 1, wherein a filler is coated inside the cavity to protect the LED chip.

6. The LED package of claim 5, wherein the filler is made of light transmitting resin.

7. The LED package of claim 5, wherein a fluorescent material is coated on the filler.

8. The LED package of claim 1, wherein a molding material is filled in the molding material filled spaces, a bottom surface and a top surface of the heat discharge body, and between the lead frames.

9. The LED package of claim 1, further comprising:
    molding fixing units on top surfaces of the lead frames to fix the lead frames.

10. The LED package of claim 1, further comprising:
    wires for electrical connection between the LED chip and the lead frames.

11. The LED package of claim 1, further comprising:
    a lens coupled to an upper part of the heat discharge body.

12. The LED package of claim 1, wherein the plurality of radially protruding heat discharge fins are spaced apart from each other with a predetermined distance.

* * * * *